US008545709B2

(12) United States Patent
Brooks et al.

(10) Patent No.: US 8,545,709 B2
(45) Date of Patent: Oct. 1, 2013

(54) CRITICAL DIMENSION CONTROL DURING TEMPLATE FORMATION

(75) Inventors: Cynthia B. Brooks, Austin, TX (US); Dwayne L. LaBrake, Cedar Park, TX (US); Niyaz Khusnatdinov, Round Rock, TX (US); Michael N. Miller, Austin, TX (US); Sidlgata V. Sreenivasan, Austin, TX (US); David James Lentz, Leander, TX (US); Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 13/441,500

(22) Filed: Apr. 6, 2012

(65) Prior Publication Data

US 2012/0187085 A1 Jul. 26, 2012

Related U.S. Application Data

(63) Continuation of application No. 12/392,685, filed on Feb. 25, 2009, now abandoned.

(60) Provisional application No. 61/031,759, filed on Feb. 27, 2008, provisional application No. 61/108,914, filed on Oct. 28, 2008.

(51) Int. Cl.
  *C03C 15/00* (2006.01)
(52) U.S. Cl.
  USPC ............................... 216/41; 216/54; 264/319
(58) Field of Classification Search
  None
  See application file for complete search history.

(56) References Cited

U.S. PATENT DOCUMENTS

| 6,334,960 | B1 | 1/2002 | Willson et al. |
| 2003/0113638 | A1 | 6/2003 | Mancini et al. |
| 2004/0009673 | A1* | 1/2004 | Sreenivasan et al. ......... 438/694 |
| 2004/0097072 | A1 | 5/2004 | Carter et al. |
| 2004/0188381 | A1 | 9/2004 | Sreenivasan et al. |
| 2004/0209123 | A1 | 10/2004 | Bajorek et al. |
| 2005/0106321 | A1 | 5/2005 | McMackin et al. |
| 2005/0270312 | A1 | 12/2005 | Lad et al. |
| 2006/0001194 | A1 | 1/2006 | Cherala et al. |
| 2006/0144814 | A1 | 7/2006 | Kolesychenko et al. |
| 2006/0214330 | A1 | 9/2006 | Dumond et al. |

(Continued)

FOREIGN PATENT DOCUMENTS

| JP | 2002231608 | 8/2002 |
| JP | 2006-203193 | 8/2006 |

(Continued)

OTHER PUBLICATIONS

Ahn et al, Fabrication of subwavelength aluminum wire grating using nanoimprint lithography and reactiv ion etching, Jan. 2005, Microelectronic Engineering, p. 314-318.*

(Continued)

*Primary Examiner* — Binh X Tran
*Assistant Examiner* — David A Cathey, Jr.
(74) *Attorney, Agent, or Firm* — Cameron A. King

(57) ABSTRACT

Thickness of a residual layer may be altered to control critical dimension of features in a patterned layer provided by an imprint lithography process. The thickness of the residual layer may be directly proportional or inversely proportional to the critical dimension of features. Dispensing techniques and material selection may also provide control of the critical dimension of features in the patterned layer.

13 Claims, 8 Drawing Sheets

(56) References Cited

U.S. PATENT DOCUMENTS

| | | |
|---|---|---|
| 2007/0138699 A1 | 6/2007 | Wuister et al. |
| 2007/0237886 A1 | 10/2007 | Dijksman et al. |
| 2008/0028958 A1 | 2/2008 | Park et al. |

FOREIGN PATENT DOCUMENTS

| | | |
|---|---|---|
| TW | 200502106 | 1/2005 |
| TW | 200728937 | 8/2007 |
| WO | 2006/023297 | 3/2006 |
| WO | 2008/102929 | 8/2008 |

OTHER PUBLICATIONS

Wu et al, One-kilobit cross-bar molecular memory circuits at 30-nm half-pitch fabricated by nanoimprint lithography, Mar. 11, 2005, Applied Physics A, p. 1173-1178.*

Pisignano et al, Rigid organic molds for nanoimprint lithography by replica molding of high glass trnasition temperature polymers, Jul. 14, 2004, J. Vac. Sci. Technol., p. 1759-1763.*

Handbook of VLSI Microlithography, 2001, ISBN:0-08155-1444-1, p. 206-209.*

Lee et al. Effect of initial resist thickness on residual layer thickness of nanoimprinted structures J. Vac. Sci. Technol. B 23(6) Nov./Dec. 2005, pp. 3023-3027.

Ahn et al. Fabrication of subwavelength aluminum wire grating using nanoimprint lithography and reactuve ion etching; Microelectronic Engineering 78-79 (Jan. 11, 2005) p. 314-318.

Wu et al. One-kilobit cross-bar molecular memory circuits at 30-nm half-pitch fabricated by nanoimprint lithography; Appl. Physics A, p. 1173-1178, Mar. 11, 2005.

* cited by examiner

CRITICAL DIMENSION CONTROL DURING TEMPLATE FORMATION

CROSS-REFERENCE TO RELATED APPLICATIONS

This application is a continuation of U.S. Ser. No. 12/392,685 filed Feb. 25, 2009, now abandoned, which claims the benefit under 35 U.S.C. §119 (e)(1) of U.S. provisional no. 61/031,759, filed on Feb. 27, 2008 and U.S. provisional no. 61/108,914, filed on Oct. 28, 2008, both of which are hereby incorporated by reference herein.

The United States government has a paid-up license in this invention and the right in limited circumstance to require the patent owner to license other on reasonable terms as provided by the terms of National Institute of Standards NIST ATP Award 70NANB4H3012.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. patent publication no. 2004/0065976, U.S. patent publication no. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
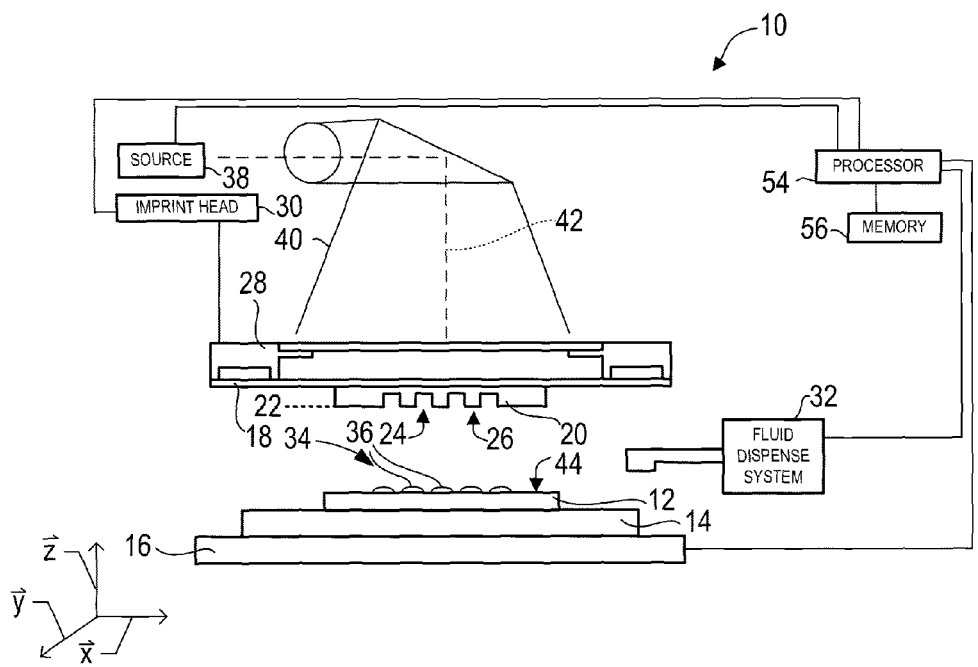
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. For example, polymerizable material 34 may be positioned upon substrate 12 using techniques such as those described in U.S. patent publication no. 2005/0270312 and U.S. patent publication no. 2005/0106321, both of which are hereby incorporated by reference herein. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. Nos. 7,157,036 and 8,076,386; both of which are hereby incorporated by reference herein.

Figure 2:
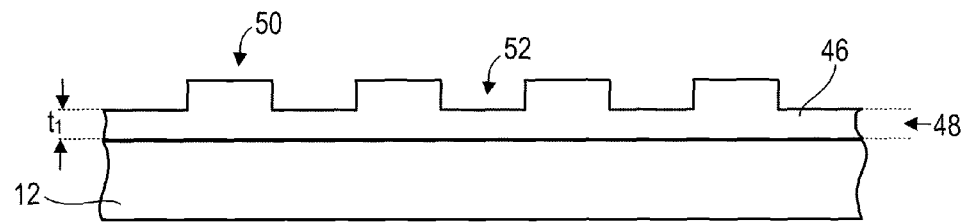
FIG. 2 illustrates a simplified side view of the substrate shown in FIG. 1 having a patterned layer positioned thereon.

Referring to FIGS. 1 and 2, system 10 may further comprise energy source 38 coupled to direct energy 40 along path 42. Imprint head 30 and stage may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or crosslink conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference herein.

Figure 3:
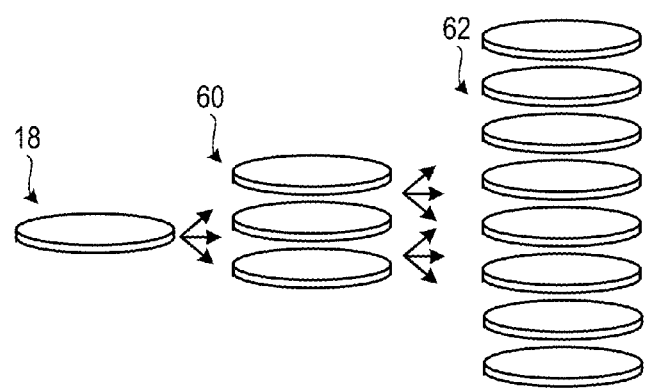
FIG. 3 illustrates a flow chart for supplying replications of a template.

As template 18 may be expensive to manufacture, replications of a template 18 may aid in reducing manufacturing costs. FIG. 3 illustrates a flow diagram for supplying such replications. Generally, template 18, hereinafter referred to as master template 18, may be replicated to form a plurality of sub-master templates 60. These sub-master templates 60 may then form working templates 62 and/or patterned wafers for device fabrication. Additionally, master template 18 may form working templates 62 and/or patterned wafers for device fabrication. The device wafers may be patterned as a whole substrate or in a step and repeat manner described in further detail in S. V. Sreenivasan, "Nano-Scale Manufacturing Enabled by Imprint Lithography," *MRS Bulletin, Special Issue on Nanostructured Materials in Information Storage*, Vol. 33, Sep. 2008, pp. 854-863, which is hereby incorporated by reference herein. For simplicity in description, the systems and methods described herein below refer to formation of sub-master template 60. However, one skilled in the art will appreciate that the techniques described herein may be used in formation of working template 62, master template 18, patterned wafers and/or generally formation of a structure on substrate 12 using imprint lithography. It should be noted that although patterned wafers are illustrated in FIG. 3, the systems and methods described herein may be applied to other imprint lithography processes (e.g., whole wafer imprinting, CMOS imprinting, and the like).

Figure 4A:
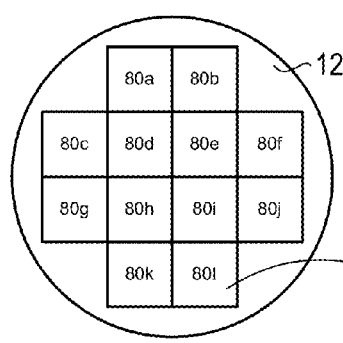
FIGS. 4A and 4B illustrate an exemplary field on a substrate during formation of a sub-master template.
Figure 4B:
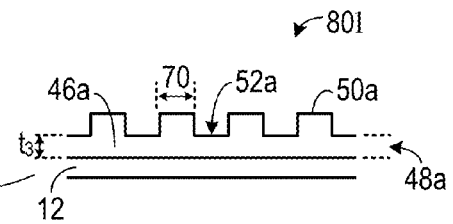

Referring to FIGS. 4A and 4B, using the step and repeat process, sub-master template 60 may be formed by patterning multiple fields 80a-80l across substrate 12. A portion of field 80l is illustrated in FIG. 4B. Features 50a and/or 52a formed on substrate 12 may have a critical dimension 70. For example, critical dimension 70 may be a width of feature 50a.

During formation of sub-master template 60, patterned layer 46a may have non-uniform critical dimension 70 across substrate 12 resulting from e-beam patterning, etching of master template 18, replicate etching, and/or the like. For example, as etching rates may vary at the edges of substrate 12 and/or transition points between materials, patterned layer 46a may have non-uniform critical dimension 70 resulting from relative loading of materials (e.g., resist, chrome, and/or the like). In this situation, a uniform thickness $t_1$ of residual layer 48a may exacerbate this non-uniformity.

Figure 5:
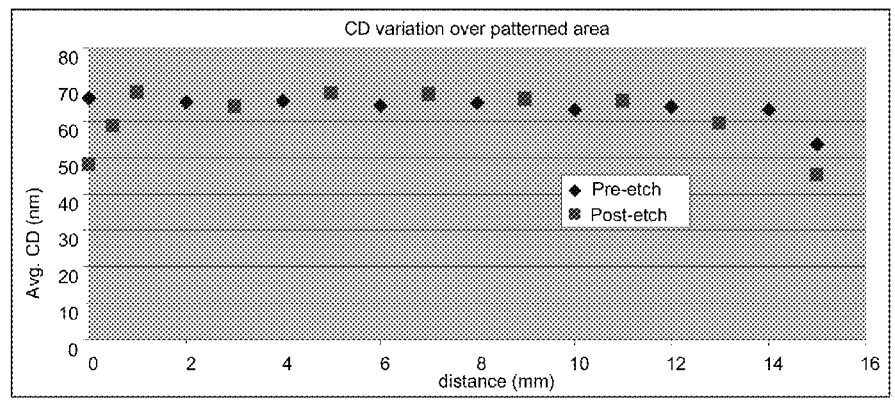
FIG. 5 illustrates a graphical representation of exemplary variations of average critical dimension across a substrate at a pre-etch stage and at a post post-etch stage.

Additionally, any non-uniformity of features 24 and/or 26 in master template 18 (shown in FIG. 3) may result in non-uniform critical dimensions 70 of features 50a and/or 52a during formation of sub-master template 62. FIG. 5 is a graphical representation of exemplary variations of average critical dimension 70 across substrate 12a at a pre-etch stage and at a post post-etch stage. At the pre-etch stage, the average critical dimension 70 across a pattern may vary based on non-uniformity of master template 18 by which it may be formed. Additionally, at the post-etch stage, variation of the average critical dimension 70 may be further exacerbated.

Figure 6A:
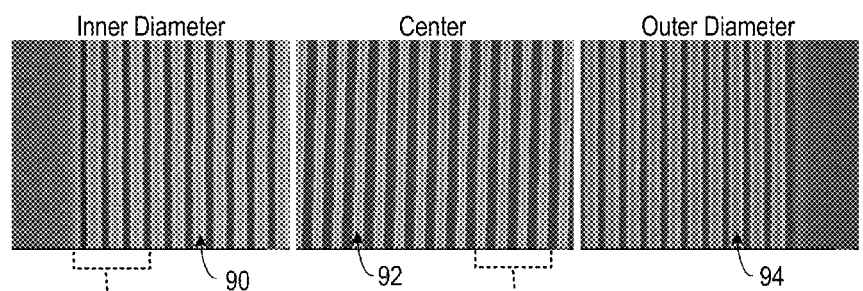
FIGS. 6A and 6B illustrate a top down view and simplified side views of exemplary variations in critical dimension between on edges and the center of a substrate.
Figure 6B:
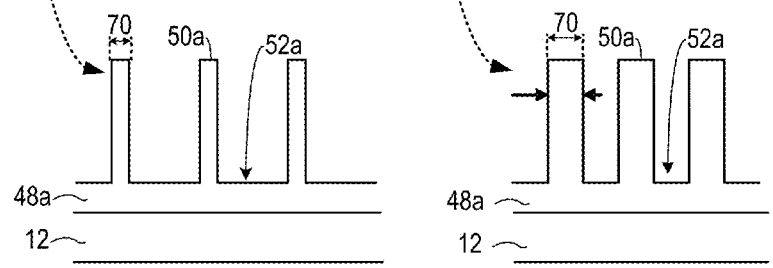

Critical dimension 70 may also be varied across patterned layer 48a due to processing and/or other similar conditions. For example, as illustrated in FIGS. 6A and 6B, critical dimension 70 at the inner edge 90 and the outer edge 92 of a pattern may be different than critical dimension 70 at the center 94 of the pattern.

Figure 7:
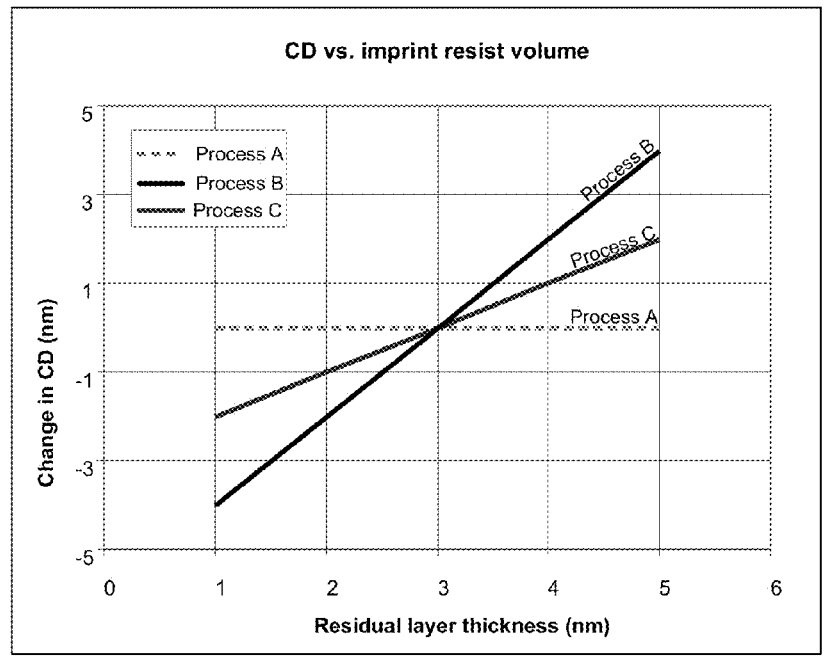
FIG. 7 illustrates a graphical representation of exemplary variations of average critical dimension in relation to residual layer thickness wherein average critical dimension proportional to residual layer thickness.

As illustrated in FIGS. 4B and 7, the magnitude of critical dimension 70 of features 50a and/or 52a may be determined as a function of thickness $t_3$ of residual layer 48a. As such, thickness $t_3$ of residual layer 48a may be altered to control critical dimension 70 of features 50a and/or 52a. Thickness $t_3$ of residual layer 48a may be directly proportional or inversely proportional to critical dimension 70 of features 50aand/or 52a. For example, thickness $t_3$ of residual layer 48a may be altered to be directly proportional and as such provide substantially uniform critical dimension 70 across substrate 12, shown by Processes B and C in FIG. 7. Alternatively, thickness $t_3$ of residual layer 48a may be altered to be inversely proportional and as such provide variations in magnitude of critical dimension 70 across substrate 12.

Etching Processes

Figure 8:
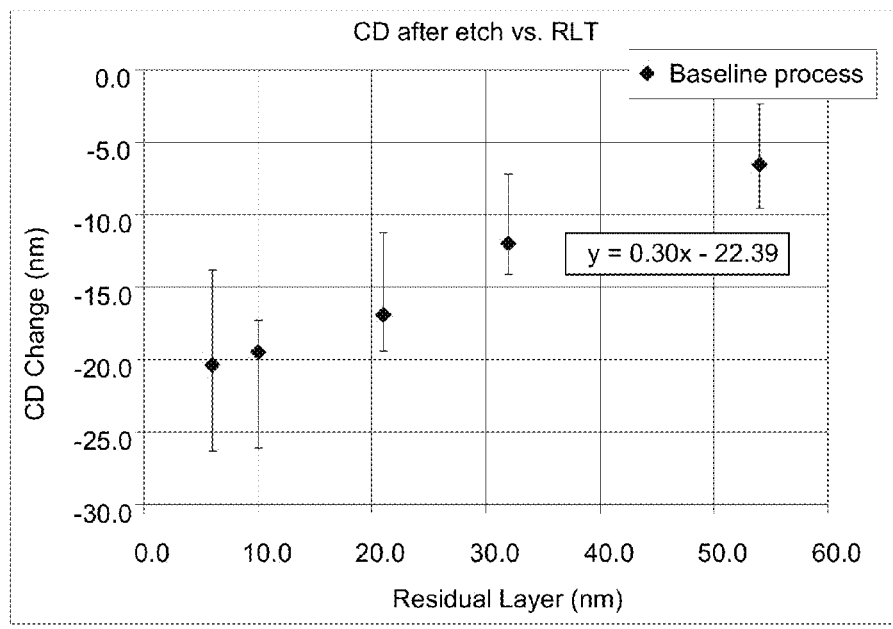
FIG. 8 illustrates a graphical representation of exemplary variation of critical dimension after a descum etching process.
Figure 9:
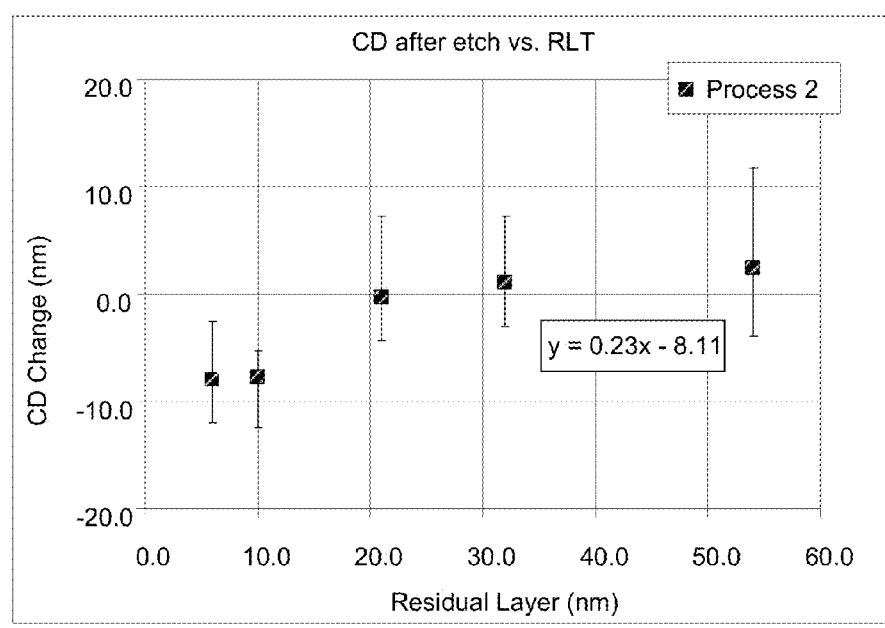
FIG. 9 illustrates a graphical representation of exemplary variation of critical dimension after a polymerizing etching process.

Referring to FIGS. 4B, 8 and 9, an etching process may be used to alter thickness $t_3$ of residual layer 48a to provide control of critical dimension 70 of features 50a and/or 52a. For example, a descum etching process (e.g., $O_2$/Ar composition) may be used to alter thickness $t_3$ of residual layer 48a. FIG. 8 illustrates a graphical representation of exemplary variation of critical dimension 70 after a descum etching process. As shown, an approximate 3 nm variation in thickness $t_3$ may provide an approximate 1 nm variation of critical dimension 70 of features 50a and/or 52a. Alternatively, a polymerizing etch process (e.g., $CF_4$/$CHF_3$/Ar composition)

may be used to alter thickness $t_3$ of residual layer 48a. Additionally, the timing of the etch process may be used to control the variation in thickness $t_3$. For example, a longer etching time may be used to further reduce the critical dimension 70.

FIG. 9 illustrates a graphical representation of exemplary variation of critical dimension 70 after a polymerizing etch process. As shown, an approximate 1 nm variation among critical dimension 70 of features 50a and/or 52a may be expected from approximately 4.5 nm of thickness $t_1$.

Figure 10:
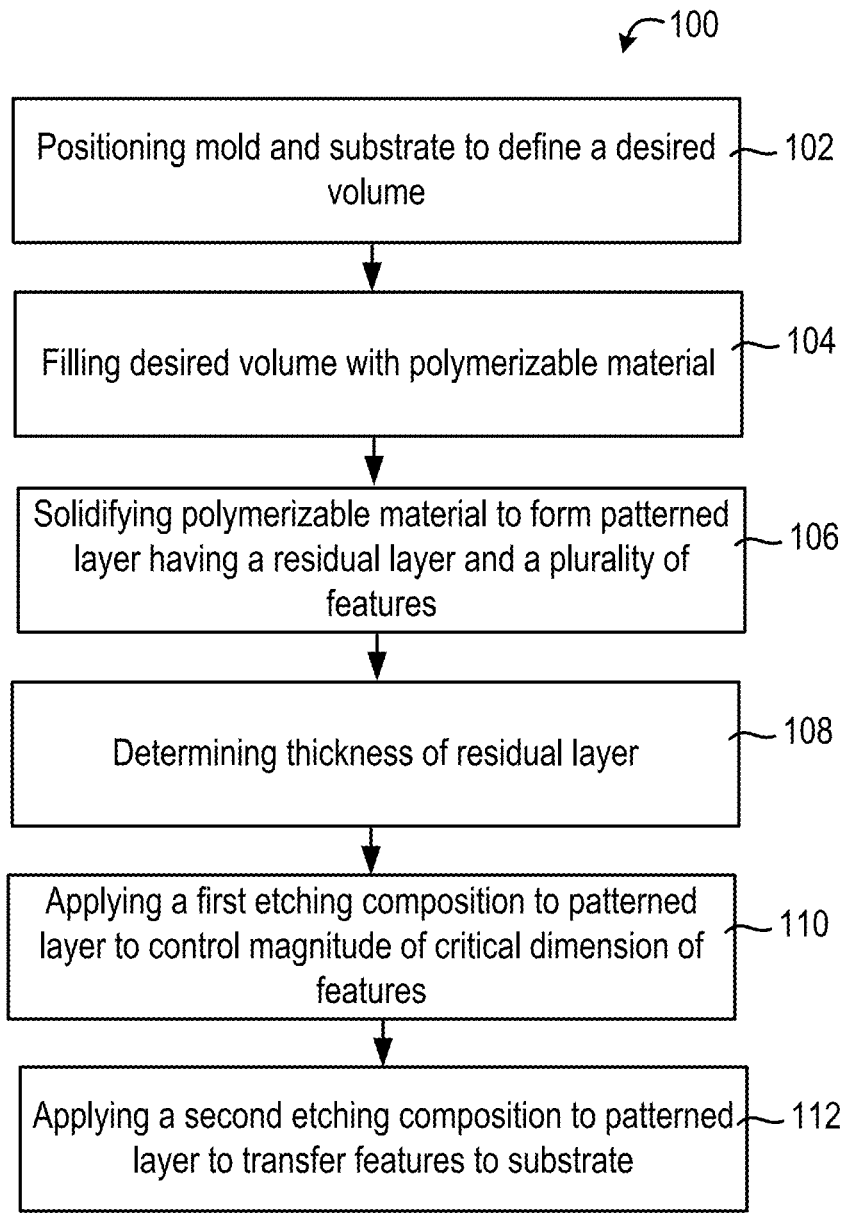
FIG. 10 illustrates a flow chart of a method for controlling the magnitude of critical dimension of features using an etching process.

FIG. 10 illustrates a flow chart of a method 100 for controlling the magnitude of critical dimension 70 of features 50a and/or 52a using an etching process. In a step 102, mold 20 and substrate 12 may be positioned to define a desired volume therebetween capable of being filled by polymerizable material 34. In a step 104, desired volume may be filled with polymerizable material 34. In a step 106, source 38 may produce energy 40, e.g., ultraviolet radiation, causing polymerizable material 34 to solidify and/or cross-link conforming to a shape of surface 44 of substrate 12 and patterning surface 22, defining patterned layer 46 on substrate 12. Patterned layer 46 may comprise residual layer 48a and a plurality of features shown as protrusions 50a and recessions 52a, with residual layer having thickness $t_3$. In a step 108, thickness $t_3$ of residual layer 48a may be determined and a desired critical dimension may be determined. In a step 110, a first etching composition may be applied to patterned layer 46 based on thickness $t_3$ of residual layer 48a alter the critical dimension of features 70 to the desired critical dimension. The first etching composition may thus be provided to control magnitude of critical dimension 70 of features 50a and/or 52a. It should be noted that the desired critical dimension and the critical dimension 70 of features 50a and/or 52a may be similar. In a step 112, a second etching composition may be applied to patterned layer 46 to etch features 50a and/or 52a into substrate 12.

Dispense Techniques

Figure 11A:
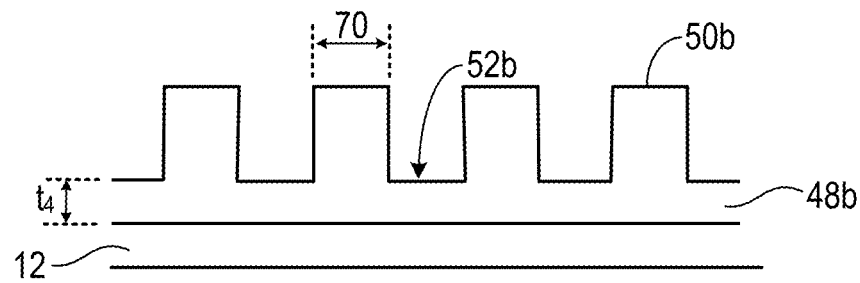
FIGS. 11A and 11B illustrate simplified side views of substrates having residual layers with different magnitudes of thickness.
Figure 11B:
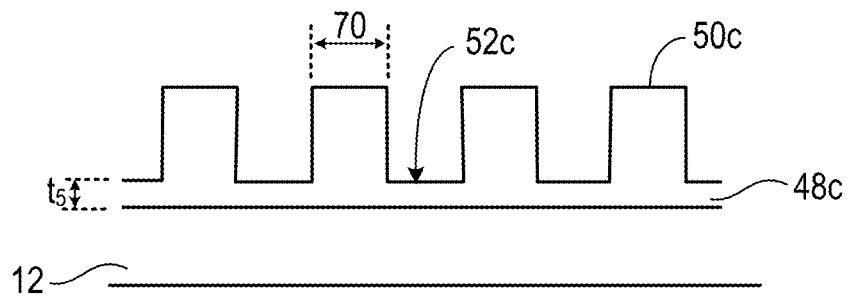

Thickness $t_3$ of residual layer 48a may also be altered by adjusting dispensing of polymerizable material 34 on substrate 12. For example, FIG. 11A illustrates substrate 12a having residual layer 48b with thickness $t_4$ and FIG. 11B illustrates substrate 12b having residual layer 48c with thickness $t_5$. The additional thickness $t_4$ of residual layer 48b formed in FIG. 11A, as compared to FIG. 11B, may provide etching that is relatively more protective of the sidewall. This may result in less variation in critical dimension 70 than the thinner residual layer 48c in FIG. 10B.

Referring to FIGS. 1 and 4B, dispensing techniques may be used to control critical dimension 70 of features 50a and/or 52a. For example, dispensing techniques may be used to provide residual layer 48a with thickness $t_3$. Thickness $t_3$ of residual layer 48a may be selected by the dispensing and positioning of polymerizable material 34 on substrate 12. The magnitude of critical dimension 70 of features 50a and/or 52a may be a function of the thickness $t_3$ of residual layer 48a. As such, dispensing and positioning of polymerizable material 34 on substrate 12 may control critical dimension 70 of features 50a and/or 52a. Exemplary dispensing techniques may include, but are not limited to, techniques further described in U.S. patent publication no. 2005/0270312, U.S. Pat. No. 7,252,715, U.S. patent publication no. 2005/0276919, U.S. patent publication no. 2005/0106321, U.S. Pat. Nos. 7,298, 456, 6,926,929, and the like.

Figure 12:
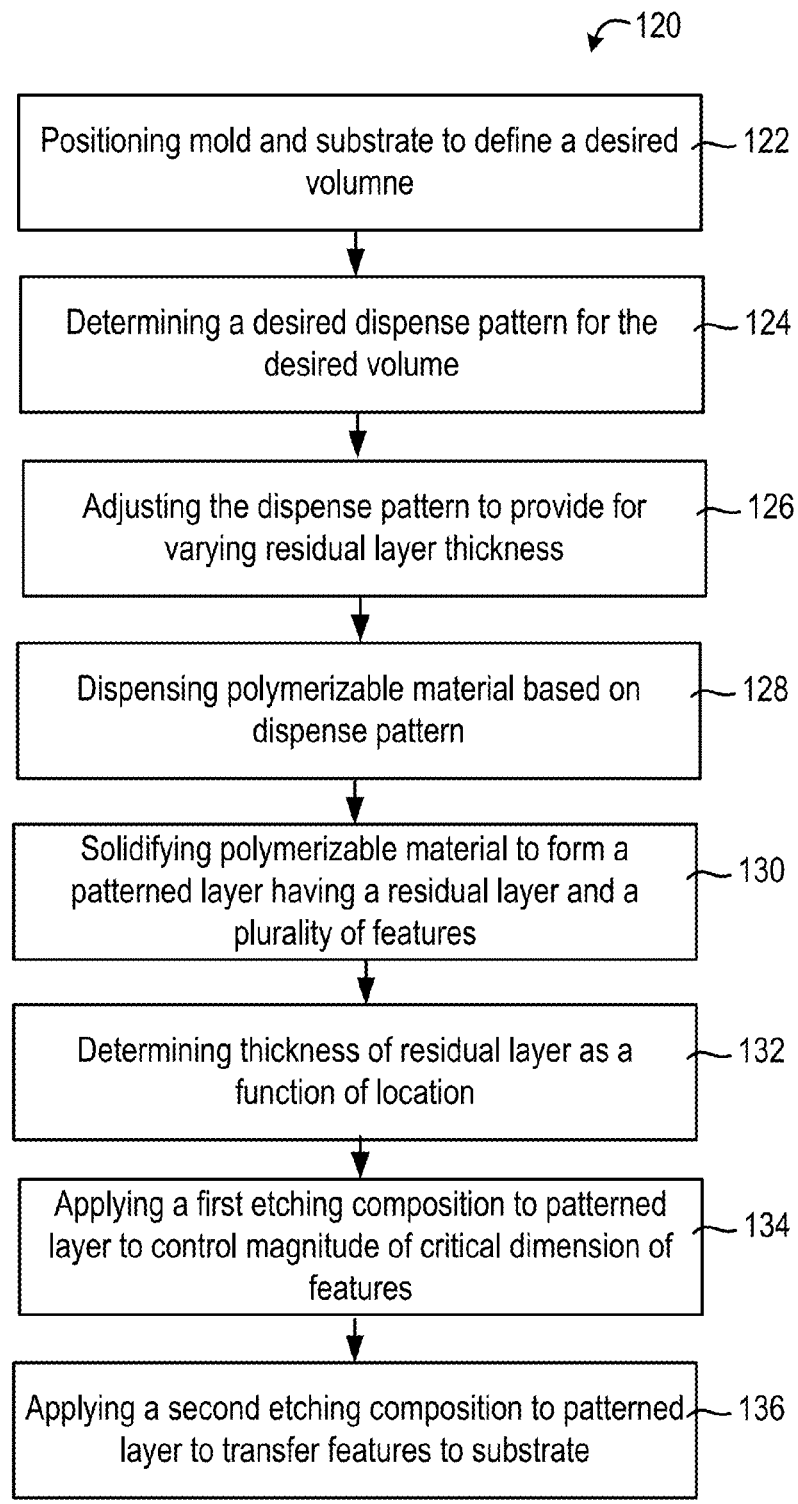
FIG. 12 illustrates a flow chart of a method for controlling critical dimension of features using a dispensing technique.

FIG. 12 illustrates a flow chart of a method 120 for controlling critical dimension 70 of features 50a and/or 52a using a dispensing technique. In a step 122, mold 20 and substrate 12 may be positioned to define a desired volume therebetween capable of being filled by polymerizable material 34. In a step 124, a dispense pattern of polymerizable material 34 for filling the desired volume may be determined. In a step 126, the dispense pattern may be adjusted to provide varying thickness $t_2$ of residual layer 48a. For example, the dispense pattern may be adjusted for dispensing a greater amount of polymerizable material 34 at the edges of field 80. In a step 128, polymerizable material 34 may be dispensed based on the dispense pattern. In a step 130, source 38 may produce energy 40, e.g., ultraviolet radiation, causing polymerizable material 34 to solidify and/or cross-link conforming to a shape of surface 44 of substrate 12 and patterning surface 22, defining patterned layer 46 on substrate 12. Patterned layer 46 may comprise residual layer 48a and a plurality of features shown as protrusions 50a and recessions 52a, with protrusions 50a having thickness $t_1$ and residual layer having thickness $t_3$. In a step 132, thickness $t_2$ of residual layer 48a may be determined. In a step 134, a first etching composition may be applied to patterned layer 46 based on thickness $t_3$ of residual layer 48a to control magnitude of critical dimension 70 of features 50a and/or 52a. In a step 136, a second etching composition may be applied to patterned layer 46 to etch features 50a and/or 52a into substrate 12.

Erosion rate

Differing polymerizable material 34 may have different erosion rates under the same etching process. As such, polymerizable material 34 with slower erosion rates may retain substantially uniform critical dimension 70 during an etching process than polymerizable material 34 having a faster erosion rate. By including different types of polymerizable material 34 having different erosion rates, critical dimension 70 of features 50a and/or 52a may be varied and/or controlled. For example, regions having a faster etch rate in an etch chamber may be imprinted using a slower-eroding polymerizable material 34. The slower-eroding polymerizable material 34 may minimize variations in critical dimension 70 of features 50a and/or 52a. In a similar fashion, regions that etch slower in an etch chamber may be imprinted using a faster-eroding polymerizable material 34. By varying the type of polymerizable material 34 dispensed on substrate 12, critical dimension 70 of features 50a and/or 52a may be controlled and/or be substantially uniform.

What is claimed is:

1. A nanoimprint lithography method for controlling critical dimension variations in patterned features, the method comprising:

determining a dispense pattern for dispensing polymerizable material within a volume defined by an imprint lithography mold when the mold is placed in superimposition with a substrate;

adjusting the dispense pattern to provide for a residual layer having variations in thickness when a patterned layer of polymerizable material is formed using the imprint lithography mold;

dispensing the volume of polymerizable material on the substrate according to the adjusted dispense pattern;

positioning the imprint lithography mold in superimposition with the dispensed polymerizable material on the substrate and contacting the dispensed polymerizable material;

solidifying the polymerizable material to form a patterned layer having a residual layer and a plurality of features, the residual layer having the variations in thickness;

determining thickness of residual layer as a function of location;

applying a first etching composition to the formed patterned layer in a first etching process, wherein the magnitude of and variations in the thickness of the residual layer control the magnitude of variation in the critical dimension of the features; and, subsequent to applying the first etching composition, applying a second etching composition to the patterned layer to transfer the features into the substrate.

2. The method of claim 1, wherein the first etching composition is a descum etching composition.

3. The method of claim 1, wherein the first etching composition is a polymerizing etching composition.

4. The method of claim 1, where in the first etching composition and the second etching composition are the same.

5. The method of claim 1, wherein the thickness of the residual layer is greater at the edges of the substrate than at the center of the substrate.

6. The method of claim 1, wherein the thickness of the residual layer is greater at the center of the substrate than at least one edge of the substrate.

7. The method of claim 1, wherein applying a second etching composition to the patterned layer to transfer the features into the substrate forms a sub-master template.

8. The method of claim 1, wherein the imprint mold is included in a sub-master template and applying a second etching composition to the patterned layer to transfer the features into the substrate forms a working template.

9. The method of claim 1, wherein the imprint mold is included in a master template and applying a second etching composition to the patterned layer to transfer the features into the substrate to form a working template.

10. The method of claim 1, wherein the polymerizable material comprises a first polymerizable material and a second polymerizable material, the first polymerizable material having a first erosion rate that is greater than the second polymerizable material.

11. The method of claim 1, wherein the residual layer thickness is proportional to the desired critical dimension.

12. The method of claim 11, wherein the residual layer thickness is inversely proportional to the desired critical dimension.

13. The method of claim 11, wherein the residual layer thickness is directly proportional to the desired critical dimension.

* * * * *